United States Patent
Yoshino (10) Patent No.: US 10,382,852 B2
(45) Date of Patent: Aug. 13, 2019

(54) CONDENSER MICROPHONE CIRCUIT

(71) Applicant: Audio-Technica Corporation, Tokyo (JP)

(72) Inventor: Satoshi Yoshino, Tokyo (JP)

(73) Assignee: Audio-Technica Corporation, Tokyo (JP)

( * ) Notice: Subject to any disclaimer, the term of this patent is extended or adjusted under 35 U.S.C. 154(b) by 0 days.

(21) Appl. No.: 16/021,571

(22) Filed: Jun. 28, 2018

(65) Prior Publication Data

US 2019/0090042 A1   Mar. 21, 2019

(30) Foreign Application Priority Data

Sep. 19, 2017   (JP) ................................. 2017-178517

(51) Int. Cl.
| | |
|---|---|
| H04R 1/04 | (2006.01) |
| H04R 3/06 | (2006.01) |
| H04R 19/04 | (2006.01) |
| H03F 3/185 | (2006.01) |
| H03F 3/50 | (2006.01) |

(52) U.S. Cl.
CPC ............... *H04R 1/04* (2013.01); *H03F 3/185* (2013.01); *H03F 3/505* (2013.01); *H04R 3/06* (2013.01); *H04R 19/04* (2013.01); *H04R 2203/00* (2013.01)

(58) Field of Classification Search
None
See application file for complete search history.

(56) References Cited

U.S. PATENT DOCUMENTS

| | | | | |
|---|---|---|---|---|
| 4,629,910 A | * | 12/1986 | Early ................. | H03F 3/1855 327/530 |
| 2002/0186855 A1 | * | 12/2002 | Akino ................. | H04R 3/00 381/111 |
| 2006/0285703 A1 | * | 12/2006 | Akino ................. | H04R 1/04 381/113 |
| 2006/0291672 A1 | * | 12/2006 | Akino ................. | H04R 3/00 381/111 |
| 2012/0213390 A1 | * | 8/2012 | Akino ................. | H04R 3/00 381/174 |

FOREIGN PATENT DOCUMENTS

| | | |
|---|---|---|
| JP | 2006-352622 A | 12/2006 |
| JP | 2015-82676 A | 4/2015 |

* cited by examiner

*Primary Examiner* — Qin Zhu
(74) *Attorney, Agent, or Firm* — W&C IP (57) ABSTRACT

Provided is a condenser microphone circuit that can support variation in power supply voltage of a phantom power supply using a wiring system of two lines. A condenser microphone circuit includes a microphone unit, an FET, a constant current diode, a collector grounding first transistor that generates an operation power supply of the FET, a first resistor that sets base potential of the first transistor, a collector grounding second transistor that amplifies an output signal from the FET, a second resistor that sets base potential of the second transistor, and an output circuit. A base of the first transistor is connected to a source of the FET, an emitter of the first transistor is connected to a drain of the FET, a base of the second transistor is connected to the drain of the FET, an emitter of the second transistor is connected to the output circuit, and the second resistor divides voltage on a cathode side of the constant current diode.

7 Claims, 5 Drawing Sheets

CONDENSER MICROPHONE CIRCUIT

TECHNICAL FIELD

The present invention relates to a condenser microphone circuit.

BACKGROUND ART

A condenser microphone includes a condenser microphone unit (hereinafter, referred to as a "unit"), an impedance conversion circuit configured by a field effect transistor (FET), and an output connector. The unit includes a diaphragm and a fixed electrode disposed to face the diaphragm. The unit generates a voice signal based on a change in capacitance between the diaphragm and the fixed electrode.

The capacitance between the diaphragm and the fixed electrode is small, that is, several tens of μm, so that output impedance of the unit is extremely high. Thus, the unit outputs an output signal (voice signal) from the unit to an output connector via the impedance conversion circuit.

To cause the impedance conversion circuit to operate, power needs to be supplied to the condenser microphone. The power is supplied to the impedance conversion circuit, for example, using a phantom power supply system defined in JEITA RC-8162C "Power supply feeding for microphones".

Generally, the FET is connected to the unit as a source follower circuit. In this case, the condenser microphone needs three lines (that is, a wiring system of three lines), which are a power supply line that supplies power to a drain of the FET, an output line that transmits a voice signal from a source of the FET, and a ground line (for example, refer to Japanese Unexamined Patent Application Publication No. 2006-352622).

The condenser microphone is small and light weight, so that the condenser microphone can be used as a gooseneck microphone in a conference room and the like. The gooseneck microphone includes a first housing portion that accommodates the unit and an impedance converter, a second housing portion that accommodates an output connector, and a flexible pipe portion that connects the first housing portion with the second housing portion.

The three lines described above (the power supply line, the output line, and the ground line) are wired inside the flexible pipe portion. For example, if a light emitting diode (LED) is disposed in the first housing portion, a line for supplying power to the LED is also wired inside the flexible pipe portion. In this way, multiple lines are wired inside the flexible pipe portion, so that the flexible pipe portion tends to be large (thick).

A technique for reducing the number of lines connected to the unit and the impedance converter by employing a wiring system of two lines in which the power supply line and the output line are common has been proposed (for example, refer to Japanese Unexamined Patent Application Publication No. 2015-82676).

Generally, an output signal (voice signal) of the wiring system of two lines tends to be distorted more easily than the output signal of the wiring system of three lines, and a dynamic range of the wiring system of two lines is lower than a dynamic range of the wiring system of three lines. The technique disclosed in Japanese Unexamined Patent Application Publication No. 2015-82676 implements a high dynamic range even with the wiring system of two lines by including a collector grounding (emitter follower) transistor connected to the FET, and a resistor connected between a base of the transistor and the collector.

SUMMARY OF INVENTION

Technical Problem

As described above, power to the FET (impedance converter) is supplied by the phantom power supply system. JEITA RC-8162C "Power supply feeding for microphones" defines three types of power supply voltage, which are 12 V±1 V, 24 V±4 V, and 48 V±4 V as a phantom power supply. Thus, when a power supply voltage of the phantom power supply is switched, the power supply voltage supplied to the condenser microphone varies within a range from 11 V to 52 V. However, the technique disclosed in Japanese Unexamined Patent Application Publication No. 2015-82676 does not support such variation in power supply voltage.

An object of the present invention is to solve the problem described above and to provide a condenser microphone circuit using a wiring system of two lines that can support variation in power supply voltage of a phantom power supply.

Solution to Problem

A condenser microphone circuit according to the present invention includes a microphone unit, an FET that converts output impedance of the microphone unit, a constant current diode that supplies a current to the FET, a collector grounding first transistor that generates an operation power supply of the FET, a first resistor that sets base potential of the first transistor, a collector grounding second transistor that amplifies the output signal from the FET, and a second resistor that sets base potential of the second transistor, and an output circuit that outputs a signal from the microphone unit. A base of the first transistor is connected to a source of the FET, an emitter of the first transistor is connected to a drain of the FET, a base of the second transistor is connected to the drain of the FET, an emitter of the second transistor is connected to the output circuit, and the second resistor divides voltage on a cathode side of the constant current diode.

Advantageous Effects of Invention

According to the present invention, a condenser microphone circuit using a wiring system of two lines that can support variation in power supply voltage of the phantom power supply can be obtained.

DESCRIPTION OF EMBODIMENTS

Condenser Microphone Circuit (1)

Embodiments of a condenser microphone circuit according to the present invention (hereinafter referred to as a "present circuit") will now be described with reference to the attached drawings.

Configuration of Condenser Microphone Circuit (1)

Figure 1:
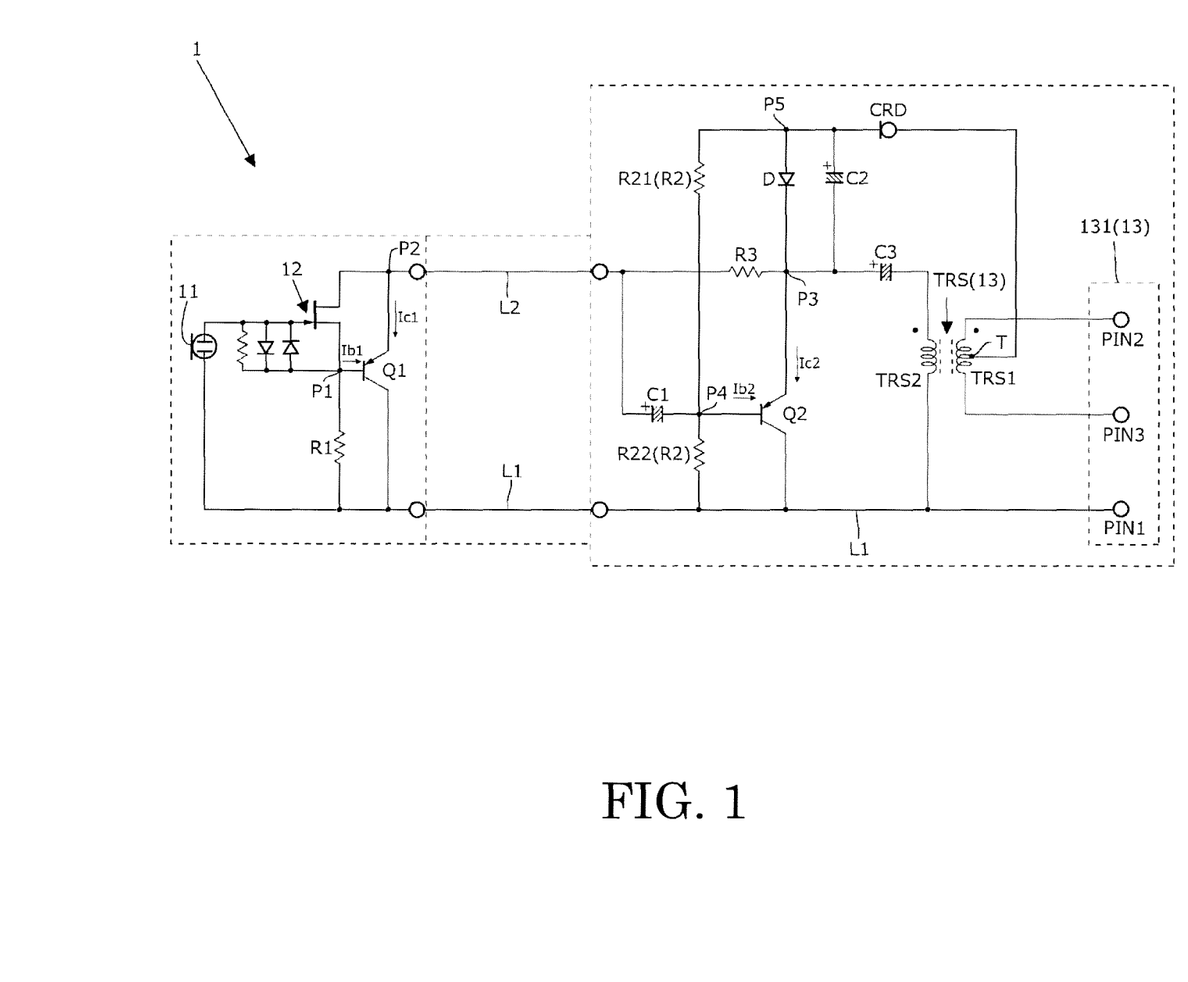
FIG. 1 is a circuit diagram illustrating an embodiment of a condenser microphone circuit according to the present invention.

FIG. 1 is a circuit diagram illustrating an embodiment of the present circuit.

A present circuit 1 converts sound waves from a sound source into an electric signal, and amplifies and outputs the electric signal. The present circuit 1 includes a condenser microphone unit (hereinafter, referred to as a "unit") 11, an FET 12, a first transistor Q1, a second transistor Q2, a constant current diode CRD, a diode D, a first resistor R1, a second resistor R2, a third resistor R3, a first condenser C1, a second condenser C2, a third condenser C3, an output circuit 13, a ground line L1, and a signal line L2.

The unit 11 converts sound waves from a sound source into an electric signal. The unit 11 includes a diaphragm (not shown) and a fixed electrode (not shown). The diaphragm is a second output end in the present invention. The fixed electrode is a first output end in the present invention. The diaphragm is disposed to face the fixed electrode, and constitutes the condenser together with the fixed electrode. The diaphragm vibrates in response to the sound waves from the sound source. Capacitance of the condenser varies in accordance with vibration of the diaphragm. The unit 11 converts the varying capacitance of the condenser into an electric signal and outputs the electric signal.

The unit may be an electret type unit in which an electret material is attached to any one of the diaphragm or the fixed electrode.

The first output end in the present invention may be the diaphragm, and the second output end in the present invention may be the fixed electrode.

The FET 12 converts output impedance of the unit 11. Input impedance of the FET 12 is high, and output impedance of the FET 12 is low. Thus, the FET 12 functions as an impedance converter of the unit 11. The FET 12 is an FET incorporating a bias circuit that incorporates a bias circuit including two diodes and one resistance element.

The first transistor Q1 generates an operation power supply of the FET 12. The first transistor Q1 is a PNP-type transistor.

The second transistor Q2 amplifies an output signal from the FET 12. The second transistor Q2 is a PNP-type transistor.

The constant current diode CRD is connected to a phantom power supply (not shown) included in an external apparatus (not shown) such as a mixer, and supplies a predetermined direct current power supply to the FET 12, the first transistor Q1, and the second transistor Q2.

The diode D supplies forward voltage to the FET 12, the first transistor Q1, and the second transistor Q2.

The first resistor R1 sets base potential of the first transistor Q1 and source potential of the FET 12.

The second resistor R2 divides voltage on a cathode side of the constant current diode CRD, and sets base potential of the second transistor Q2. The second resistor R2 includes a first voltage dividing resistor R21 and a second voltage dividing resistor R22.

The third resistor R3 is a resistor for bias of the first transistor Q1.

The first condenser C1, the second condenser C2, and the third condenser C3 are alternating current connection electrolytic condensers (coupling condensers).

The output circuit 13 outputs a signal from the unit 11 to an external apparatus via the FET 12, the first transistor Q1, and the second transistor Q2. The output circuit 13 includes an output transformer TRS and an output connector 131.

The output transformer TRS adjusts balance of the output signal from the second transistor Q2, outputs the signal to the output connector 131, and supplies a direct current power supply from the phantom power supply to the constant current diode CRD. The output transformer TRS includes a primary winding TRS1 with a middle point tap T, and a secondary winding TRS2.

The output connector 131 is, for example, an output connector defined in JEITA RC-5236 "Circular connectors, latch lock type for audio equipment". The output connector 131 includes a first pin PIN1 for grounding, a second pin PIN2 on a hot side of a signal, and a third pin PIN3 on a cold side of a signal.

The ground line L1 is a reference potential line connected to reference potential (ground) of an external apparatus via the first pin PIN1. The signal line L2 is an output line for transmitting an output signal from the first transistor Q1, and also a power supply line for supplying direct current power supply from the constant current diode CRD.

Connection of Condenser Microphone Circuit (1)

Next, the following describes connection of the present circuit 1.

The fixed electrode of the unit 11 is connected to a gate of the FET 12. The diaphragm of the unit 11 is connected (grounded) to one end of the ground line L1. The other end of the ground line L1 is connected to the first pin PIN1 of the output connector 131.

A base of the first transistor Q1 is connected to a source of the FET 12. An emitter of the first transistor Q1 is connected to a drain of the FET 12. A collector of the first transistor Q1 is connected to the ground line L1 (ground). Thus, when the first transistor Q1 operates (turns on), forward drop voltage (about 0.7 V) between the base and the emitter of the first transistor Q1 is applied to between the drain and the source of the FET 12. As a result, the FET 12 operates. That is, the first transistor Q1 generates an operation power supply of the FET 12.

As described above, the collector of the first transistor Q1 is connected (grounded) to the ground line L1. That is, the first transistor Q1 is a collector grounding (emitter follower) transistor, the collector of which is grounded. Thus, the output signal from the source of the FET 12 is current-amplified by the emitter follower of the first transistor Q1, and output to a connection point P2 of the emitter of the first transistor Q1 and the drain of the FET 12. As a result, output impedance of the first transistor Q1 is lowered.

The first resistor R1 is connected to between the base of the first transistor Q1 (a connection point P1 of the base of the first transistor Q1 and the source of the FET 12) and the ground line L1 (the collector of the first transistor Q1). As described above, the base potential of the first transistor Q1 is set based on a resistance value of the first resistor R1.

One end of the signal line L2 is connected to the connection point P2. The other end of the signal line L2 is connected to one end of the third resistor R3, and connected to the base of the second transistor Q2 via the first condenser C1. That is, the base of the second transistor Q2 is connected to the drain of the FET 12 via the first condenser C1 and the signal line L2. As a result, the output signal from the first transistor Q1 (FET 12) is input to the base of the second transistor Q2.

An emitter of the second transistor Q2 is connected to the other end of the third resistor R3. A connection point P3 of the emitter of the second transistor Q2 and the third resistor R3 is connected to one end of the secondary winding TRS2 of the output transformer TRS via the third condenser C3. That is, the emitter of the second transistor Q2 is connected to the output circuit 13 via the third condenser C3. The other end of the secondary winding TRS2 of the output transformer TRS is connected (grounded) to the ground line L1.

A collector of the second transistor Q2 is connected (grounded) to the ground line L1. That is, the second transistor Q2 is a collector grounding (emitter follower) transistor, the collector of which is grounded. Thus, the output signal from the first transistor Q1 (FET 12) is current-amplified by the emitter follower of the second transistor Q2, and output to the secondary winding TRS2 of the output transformer TRS via the third condenser C3 from the emitter of the second transistor Q2.

One end of the primary winding TRS1 of the output transformer TRS is connected to the second pin PIN2 of the output connector 131. The other end of the primary winding TRS1 of the output transformer TRS is connected to the third pin PIN3 of the output connector 131. The middle point tap T of the output transformer TRS is connected to an anode of the constant current diode CRD.

The first pin PIN1 of the output connector 131 is connected to a negative side of the phantom power supply, and the second pin PIN2 and the third pin PIN3 are connected to a positive side of the phantom power supply. Direct current power supply from the phantom power supply is supplied to the anode of the constant current diode CRD via the middle point tap T of the primary winding TRS1 of the output transformer TRS.

The cathode of the constant current diode CRD is connected to one end of the first voltage dividing resistor R21. The other end of the first voltage dividing resistor R21 is connected to one end of the second voltage dividing resistor R22. That is, the first voltage dividing resistor R21 is connected to the second voltage dividing resistor R22 in series. The other end of the second voltage dividing resistor R22 is connected (grounded) to the ground line L1.

A connection point P4 of the first voltage dividing resistor R21 and the second voltage dividing resistor R22 also serves as a connection point of the base of the second transistor Q2 and the first condenser C1. That is, the connection point P4 is connected to the base of the second transistor Q2. That is, the first voltage dividing resistor R21 and the second voltage dividing resistor R22 are voltage dividing resistors that divide voltage on the cathode side of the constant current diode CRD. Thus, the base potential of the second transistor Q2 is set based on a ratio between a resistance value of the first voltage dividing resistor R21 and a resistance value of the second voltage dividing resistor R22.

An anode of the diode D is connected to a connection point P5 of the constant current diode CRD and the first voltage dividing resistor R21. A cathode of the diode D is connected to the connection point P3 of the emitter of the second transistor Q2 and the third resistor R3. That is, the diode D is connected in a forward direction to the emitter of the second transistor Q2 from the cathode of the constant current diode CRD. As a result, a potential difference between both ends of the first voltage dividing resistor R21 is about 1.4 V, which is an added value of electric potential for causing the diode D and the second transistor Q2 to operate (voltage for turning on the diode D and the second transistor Q2), that is, forward drop voltage of the diode D (about 0.7 V), and forward drop voltage (about 0.7 V) between the base and the emitter of the second transistor Q2. The connection point P3 is connected to the phantom power supply via the diode D and the constant current diode CRD. Thus, electric potential of the emitter serving as an output terminal of the second transistor Q2 can be set to be close to power supply voltage (voltage of a direct current power supply from the phantom power supply). That is, for example, by setting the electric potential of the emitter to be a half value of the power supply voltage, an upper limit of maximum amplitude of the electric potential of the emitter can be set to be close to the power supply voltage (for example, when the power supply voltage is 48 V, the maximum amplitude of the electric potential of the emitter can be set to be about 23.3 V, which has dropped from 24 V by about 0.7 V).

As the cathode of the diode D is connected to the connection point P3 of the emitter of the second transistor Q2 and the third resistor R3, the diode D is connected in a forward direction to the emitter of the first transistor Q1 (the drain of the FET 12) via the third resistor R3. As a result, the cathode of the constant current diode CRD is connected to the drain of the FET 12 via the diode D and the third resistor R3. That is, the third resistor R3 is connected to between the constant current diode CRD and the drain of the FET 12.

The second condenser C2 is connected between the connection point P3 and the connection point P5. That is, the second condenser C2 is connected in parallel with the diode D.

Operation of Condenser Microphone Circuit (1)

Next, the following describes an operation of the present circuit 1.

First, direct current power supply from the phantom power supply is supplied to the constant current diode CRD via the middle point tap T of the primary winding TRS1 of the output transformer TRS. The constant current diode CRD flows a constant current in a range of power supply voltage (11 V to 52 V) of the phantom power supply. That is, the current flowing in the constant current diode CRD is constant. The current from the constant current diode CRD is diverted into a base current Ib2 that flows in the base of the second transistor Q2 via the first voltage dividing resistor R21, a collector current Ic2 that flows between the emitter and the collector of the second transistor Q2 via the diode D, and a collector current Ic1 that flows between the emitter and the collector of the first transistor Q1 via the diode D and the third resistor R3. The total sum of the base current Ib2, the collector current Ic2, and the collector current Ic1 is constant.

The power supply voltage of the phantom power supply varies within a permissible range (for example, the permissible range of the power supply voltage 48 V is ±4 V). In the present circuit 1, the direct current power supply from the phantom power supply is supplied to the constant current diode CRD. Thus, if the power supply voltage of the phantom power supply varies within the permissible range, the current output from the constant current diode CRD is constant.

Subsequently, the connection point P4 of the first voltage dividing resistor R21 and the second voltage dividing resistor R22, that is, the base potential of the second transistor Q2 is set. As described above, the base potential of the second transistor Q2 is set based on a ratio between the resistance value of the first voltage dividing resistor R21 and the resistance value of the second voltage dividing resistor R22.

When the electric potential of the connection point P4 is set, the electric potential (electric potential on the cathode side of the diode D) of the connection point P3 of the emitter of the second transistor Q2 and the diode D (the third resistor R3, the third condenser C3) is set. The electric potential of the connection point P3 is higher than the base potential of the second transistor Q2 by the forward drop voltage (about 0.7 V) between the base and the emitter of the second transistor Q2.

When the electric potential of the connection point P3 is set, the electric potential (electric potential on the anode side of the diode D) of the connection point P5 of the anode of the diode D and the constant current diode CRD (first voltage dividing resistor R21) is set. The electric potential on the anode side of the diode D is higher than the electric potential of the connection point P3 by the forward drop voltage (about 0.7 V) of the diode D.

When the electric potential of the connection point P3 is set, the electric potential of the connection point P2 of the emitter of the first transistor Q1 and the drain of the FET 12 is set. The electric potential of the connection point P2 is set based on the resistance value of the third resistor R3.

When the electric potential of the connection point P2 is set, the electric potential of the connection point P1 of the source of the FET 12 and the base of the first transistor Q1 (the base potential of the first transistor Q1) is set. The electric potential of the connection point P1 is lower than the electric potential of the connection point P2 by the forward drop voltage (0.7 V) between the base and the emitter of the first transistor Q1.

In this way, in the present circuit 1, the electric potential of the connection point P4, the electric potential of the connection point P3, the electric potential of the connection point P5, the electric potential of the connection point P2, and the electric potential of the connection point P1 are sequentially set. Each electric potential becomes a proper value independent of the power supply voltage of the phantom power supply. Thus, each base potential of the first transistor Q1 and the second transistor Q2 is set to be a proper value in accordance with the power supply voltage of the phantom power supply. Thus, the operation of the first transistor Q1 and the operation of the second transistor Q2 are stabilized. That is, the present circuit 1 operates at a constant voltage in accordance with switching of the power supply voltage of the phantom power supply.

Figure 2:
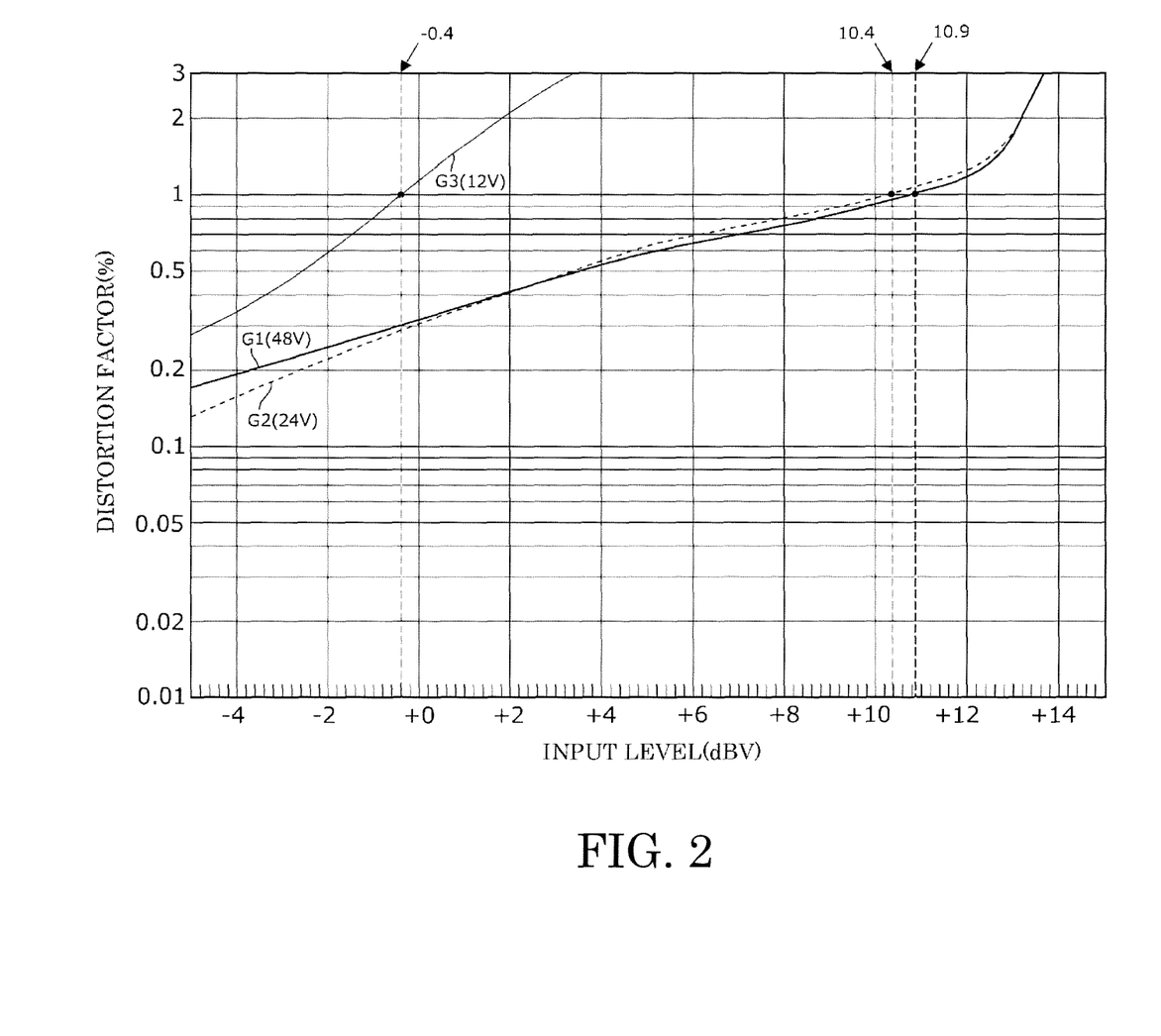
FIG. 2 is a graph representing a relation between an input level and a distortion factor of an output signal in the condenser microphone circuit of FIG. 1.

FIG. 2 is a graph representing a relation between an input level (dBV) and a distortion factor (%) of the output signal in the present circuit 1. In FIG. 2, a graph of the power supply voltage 48 V is denoted by a reference sign "G1", a graph of the power supply voltage 24 V is denoted by a reference sign "G2", and a graph of the power supply voltage 12 V is denoted by a reference sign "G3".

A permissible reference upper limit of voice quality is a distortion factor of 1%. The input level is 10.9 dBV when the present circuit 1 is operated at the power supply voltage 48 V. The input level is 10.4 dBV when the present circuit 1 is operated at the power supply voltage 24 V. The input level is −0.4 dBV when the present circuit 1 is operated at the power supply voltage 12 V.

Figure 3:
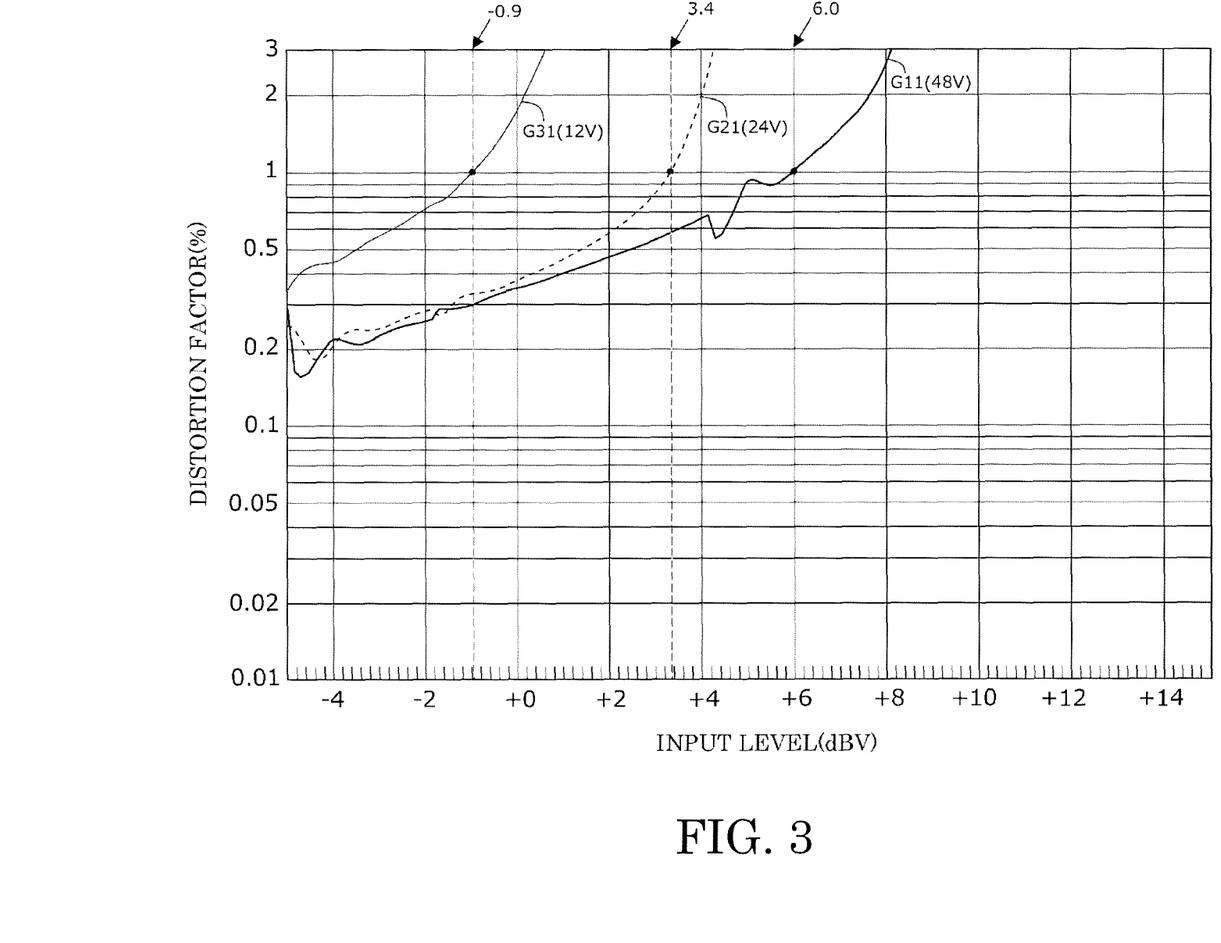
FIG. 3 is a graph representing a relation between an input level and the distortion factor of an output signal in a conventional condenser microphone circuit.

FIG. 3 is a graph representing a relation between the input level (dBV) and the distortion factor (%) of the output signal in a conventional condenser microphone circuit using a wiring system of three lines (hereinafter, referred to as a "conventional circuit"). In FIG. 3, the graph of the power supply voltage 48 V is denoted by a reference sign "G11", the graph of the power supply voltage 24 V is denoted by a reference sign "G21", and the graph of the power supply voltage 12 V is denoted by a reference sign "G31".

The input level is 6.0 dBV when the conventional circuit is operated at the power supply voltage 48 V. The input level is 3.4 dBV when the conventional circuit is operated at the power supply voltage 24 V. The input level is −0.9 dBV when the conventional circuit is operated at the power supply voltage 12 V.

In this way, the input level of the distortion factor of 1% of the present circuit 1 largely increases when the present circuit 1 is operated at the power supply voltage 24 V and when the present circuit 1 is operated at the power supply voltage 48 V as compared with the input level of the distortion factor of 1% of the conventional circuit. A dynamic range is a width between the input level of the distortion factor of 1% and a hearing sense correction value. That is, the dynamic range of the present circuit 1 is improved when the present circuit 1 is operated at the power supply voltage 24 V and when the present circuit 1 is operated at the power supply voltage 48 V as compared with the dynamic range of the conventional circuit.

The base current Ib1 of the first transistor Q1 and the base current Ib2 of the second transistor Q2 vary (fluctuate) depending on an individual difference, a temperature change, and the like of the first transistor Q1 and the second transistor Q2. Similarly, an alternating current amplification factor hfe1 of the first transistor Q1 and an alternating current amplification factor hfe2 of the second transistor Q2 vary. As a result, the voltage between the base and the emitter of the first transistor Q1 and the voltage between the base and the emitter of the second transistor Q2 vary. The variation in the voltage between the base and the emitter is absorbed by the third resistor R3 connected to between the emitter of the first transistor Q1 and the emitter of the second transistor Q2.

Usage Example of Condenser Microphone Circuit (1)

Next, the following describes a usage example of the present circuit 1.

Figure 4:
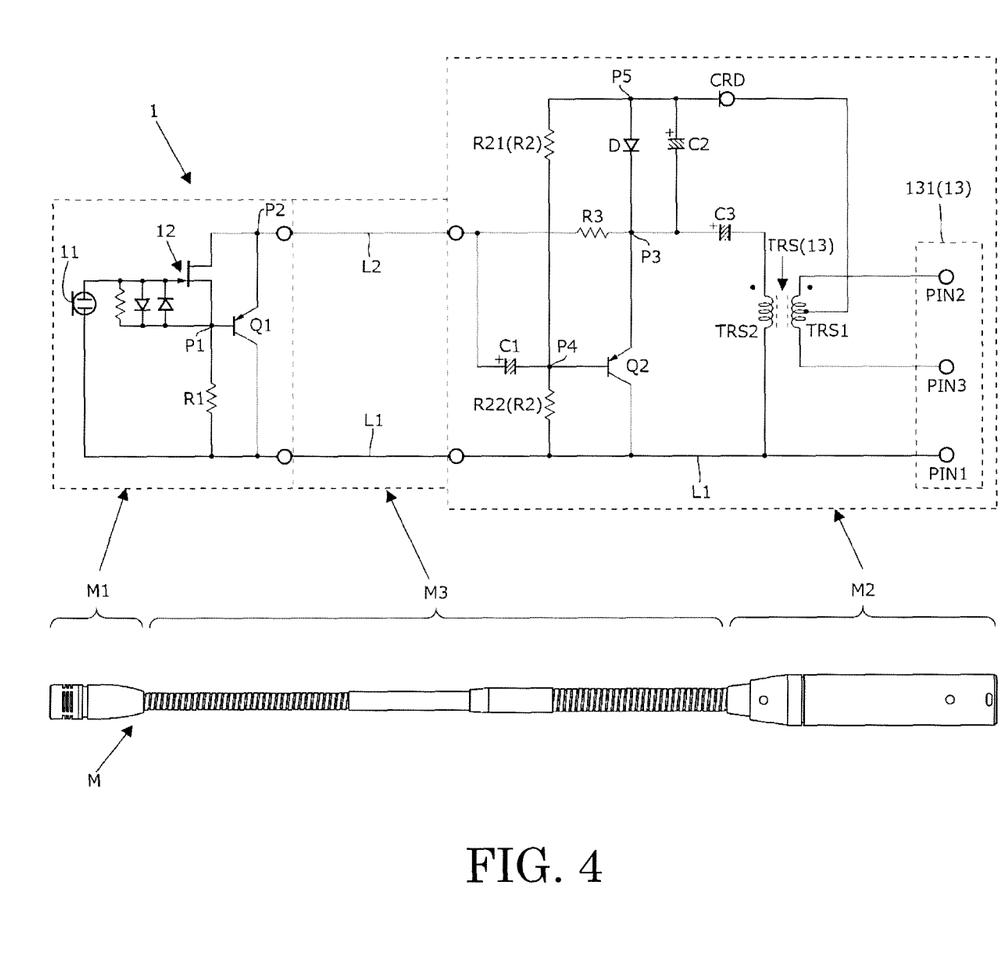
FIG. 4 is an outline drawing illustrating an example of a condenser microphone in which a condenser microphone circuit according to the present invention is used.

FIG. 4 is an outline drawing illustrating an example of a microphone in which the present circuit 1 is used.

FIG. 4 illustrates a gooseneck microphone as an example of the microphone in which the present circuit 1 is used, and the present circuit 1.

A microphone M includes a first housing portion M1 that collects sound waves, a second housing portion M2 that outputs a voice signal, a flexible pipe portion M3 that connects the first housing portion M1 with the second housing portion M2, and the present circuit 1.

The first housing portion M1 accommodates the unit 11, the FET 12, the first transistor Q1, and the first resistor R1.

The second housing portion M2 accommodates the second transistor Q2, the constant current diode CRD, the diode D, the second resistor R2, the third resistor R3, the first condenser C1, the second condenser C2, the third condenser C3, and the output circuit 13 (output connector 131).

The flexible pipe portion M3 accommodates the ground line L1 and the signal line L2.

In this way, the present circuit 1 is a wiring system of two lines, so that the microphone M in which the present circuit 1 is used can downsize the first housing portion M1 and the flexible pipe portion M3.

Condenser Microphone Circuit (2)

Next, the following describes another embodiment of the condenser microphone circuit according to the present invention focusing on a portion different from that in the embodiment described above (hereinafter, referred to as a "first embodiment"). In the condenser microphone circuit according to the present embodiment, the configuration of the output circuit is different from that in the first embodiment.

Configuration of Condenser Microphone Circuit (2)

Figure 5:
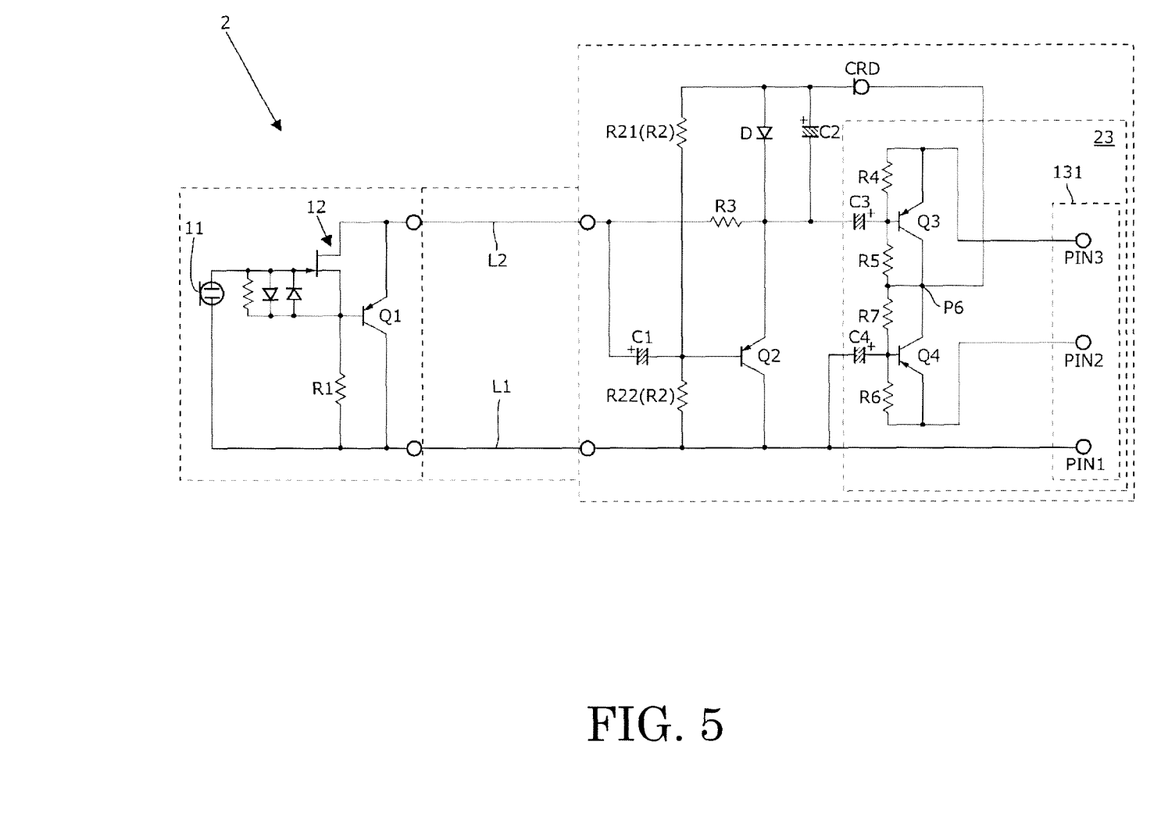
FIG. 5 is a circuit diagram illustrating another embodiment of a condenser microphone circuit according to the present invention.

FIG. 5 is a circuit diagram illustrating another embodiment of the present circuit.

A present circuit 2 includes an output circuit 23.

The output circuit 23 outputs a signal from the unit 11 to an external apparatus via the FET 12, the first transistor Q1, and the second transistor Q2. The output circuit 23 includes a third transistor Q3, a fourth transistor Q4, a fourth resistor R4, a fifth resistor R5, a sixth resistor R6, a seventh resistor R7, the output connector 131, the third condenser C3, and a fourth condenser C4.

The third transistor Q3 and the fourth transistor Q4 amplify the output signal from the second transistor Q2, output the signal to the output connector 131, and supply the direct current power supply from the phantom power supply to the constant current diode CRD. The third transistor Q3 and the fourth transistor Q4 are PNP-type transistors.

The fourth resistor R4 and the fifth resistor R5 set base potential of the third transistor Q3.

The sixth resistor R6 and the seventh resistor R7 set base potential of the fourth transistor Q4.

Connection of Condenser Microphone Circuit (2)

Next, the following describes connection of the present circuit 2.

A base of the third transistor Q3 is connected to the third condenser C3, the fourth resistor R4, and the fifth resistor R5. As a result, the third transistor Q3 is connected to the fixed electrode (first output end) of the unit 11 via the third condenser C3, the third resistor R3, the signal line L2, and the FET 12. An emitter of the third transistor Q3 is connected to the fourth resistor R4 and the third pin PIN3 of the output connector 131. A collector of the third transistor Q3 is connected to the fifth resistor R5 and a collector of the fourth transistor Q4. The base potential of the third transistor Q3 is set based on a ratio between a resistance value of the fourth resistor R4 and a resistance value of the fifth resistor R5.

A base of the fourth transistor Q4 is connected to the fourth condenser C4, the sixth resistor R6, and the seventh resistor R7. An emitter of the fourth transistor Q4 is connected to the sixth resistor R6 and the second pin PIN2 of the output connector 131. A collector of the fourth transistor Q4 is connected to the seventh resistor R7 and the collector of the third transistor Q3. The base potential of the fourth transistor Q4 is set based on a ratio between a resistance value of the sixth resistor R6 and a resistance value of the seventh resistor R7.

A connection point P6 of the collector of the third transistor Q3 and the collector of the fourth transistor Q4 is connected to the anode of the constant current diode CRD, and connected to the ground line L1 (grounded) via the constant current diode CRD and the second resistor R2. That is, the third transistor Q3 and the fourth transistor Q4 are collector grounding (emitter follower) transistors, the collectors of which are grounded.

The fourth condenser C4 is connected to the ground line L1. As a result, the fourth transistor Q4 is connected to the diaphragm (second output end) of the unit 11 via the ground line L1.

The base of the third transistor Q3 is connected to the drain of the FET 12 (the emitter of the first transistor Q1) via the third condenser C3 and the third resistor R3, and connected to the emitter of the second transistor Q2 via the third condenser C3. That is, the emitter of the second transistor Q2 is connected to between the drain of the FET 12 and the base of the third transistor Q3.

As the output circuit 23 is connected in this way, the present circuit 2 operates as a transformerless condenser microphone circuit similarly to the present circuit 1 according to the first embodiment.

Conclusion

According to each embodiment described above, the base potential of the second transistor Q2, the electric potential of the connection point P3, the electric potential of the connection point P5, the electric potential of the connection point P2, and the electric potential of the connection point P1 are sequentially set. Each electric potential is set to be a proper value in accordance with the power supply voltage of the phantom power supply. Thus, the base potential of each of the first transistor Q1 and the second transistor Q2 is set to be a proper value in accordance with the power supply voltage of the phantom power supply. That is, the present circuit operates at a constant voltage in accordance with switching of the power supply voltage of the phantom power supply.

According to each embodiment described above, the base of the collector grounding first transistor Q1 is connected to the source of the FET 12, and the emitter of the first transistor Q1 is connected to the drain of the FET 12. Thus, wiring from the FET 12 and the first transistor Q1 is two, that is, the ground line L1 and the signal line L2. That is, the present circuit is a wiring system of two lines.

Further, according to the embodiments described above, the dynamic range of the present circuit is improved when the present circuit is operated at the power supply voltage 24 V and when the present circuit is operated at the power supply voltage 48 V as compared with the dynamic range of the conventional circuit.

In this way, the present circuit is a condenser microphone circuit using a wiring system of two lines that can support variation in the power supply voltage of the phantom power supply.

The invention claimed is:

1. A condenser microphone circuit comprising:
   a microphone unit;
   a field effect transistor (FET) configured to convert output impedance of the microphone unit;
   a constant current diode configured to supply a current to the FET;
   a collector grounding first transistor configured to generate an operation power supply of the FET;
   a first resistor configured to set base potential of the first transistor;
   a collector grounding second transistor configured to amplify an output signal from the FET;
   a second resistor configured to set base potential of the second transistor; and
   an output circuit configured to output a signal from the microphone unit, wherein
   a base of the first transistor is connected to a source of the FET,
   an emitter of the first transistor is connected to a drain of the FET,
   a base of the second transistor is connected to a drain of the FET,
   an emitter of the second transistor is connected to the output circuit, and
   the second resistor divides voltage on a cathode side of the constant current diode.

2. The condenser microphone circuit according to claim 1, wherein
the second resistor comprises:
a first voltage dividing resistor; and
a second voltage dividing resistor connected to the first voltage dividing resistor in series,
a connection point of the first voltage dividing resistor and the second voltage dividing resistor is connected to the base of the second transistor,
one end of the first voltage dividing resistor is connected to a cathode of the constant current diode,
the other end of the first voltage dividing resistor is connected to one end of the second voltage dividing resistor, and
the other end of the second voltage dividing resistor is grounded.

3. The condenser microphone circuit according to claim 1, wherein the cathode of the constant current diode is connected to the drain of the FET, the condenser microphone circuit comprising:
a third resistor connected to between the cathode of the constant current diode and the drain of the FET.

4. The condenser microphone circuit according to claim 1, further comprising:
a diode connected to the emitter of the second transistor from the cathode of the constant current diode in a forward direction.

5. The condenser microphone circuit according to claim 1, wherein
the output circuit comprises an output transformer connected to a phantom power supply,
a middle point of primary winding of the output transformer is connected to an anode of the constant current diode, and
the emitter of the second transistor is connected to secondary winding of the output transformer.

6. The condenser microphone circuit according to claim 1, wherein
the output circuit comprises:
a collector grounding third transistor connected to a first output end of the microphone unit; and
a collector grounding fourth transistor connected to a second output end of the microphone unit,
a connection point of a collector of the third transistor and a collector of the fourth transistor is connected to an anode of the constant current diode, and
the emitter of the second transistor is connected to between the drain of the FET and a base of the third transistor.

7. The condenser microphone circuit according to claim 1, wherein
the output circuit comprises an output connector, the output connector comprising:
a first pin connected to reference potential;
a second pin on a hot side of an output signal from the emitter of the first transistor; and
a third pin on a cold side of the output signal from the emitter of the first transistor.

* * * * *